(12) United States Patent
Barve et al.

(10) Patent No.: US 11,888,293 B2
(45) Date of Patent: Jan. 30, 2024

(54) BOTTOM-EMITTING EMITTER ARRAY WITH A BOTTOM SIDE METAL LAYER

(71) Applicant: Lumentum Operations LLC, San Jose, CA (US)

(72) Inventors: Ajit Vijay Barve, San Jose, CA (US); Eric R. Hegblom, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 406 days.

(21) Appl. No.: 17/247,659

(22) Filed: Dec. 18, 2020

(65) Prior Publication Data

US 2022/0131346 A1 Apr. 28, 2022

Related U.S. Application Data

(60) Provisional application No. 63/198,554, filed on Oct. 27, 2020.

(51) Int. Cl.
*H01S 5/42* (2006.01)
*H01S 5/183* (2006.01)
*H01S 5/042* (2006.01)

(52) U.S. Cl.
CPC .......... *H01S 5/423* (2013.01); *H01S 5/04257* (2019.08); *H01S 5/18305* (2013.01); *H01S 5/18361* (2013.01); *H01S 5/18386* (2013.01); *H01S 5/18394* (2013.01)

(58) Field of Classification Search
CPC .. H01S 5/423; H01S 5/04257; H01S 5/18305; H01S 5/18361; H01S 5/18386; H01S 5/18394
See application file for complete search history.

(56) References Cited

U.S. PATENT DOCUMENTS

| | | | |
|---|---|---|---|
| 2015/0311673 A1* | 10/2015 | Wang | H01S 5/18305 372/27 |
| 2017/0256915 A1* | 9/2017 | Ghosh | H01S 5/1833 |
| 2018/0198254 A1* | 7/2018 | Tatum | H01S 5/18391 |
| 2020/0067278 A1* | 2/2020 | Han | H01S 5/18377 |

OTHER PUBLICATIONS

Foresi et al., "VCSEL arrays for quasi-continuous-wave applications," Proc. of SPIE, vol. 10938, 2019, 10 Pages.

* cited by examiner

*Primary Examiner* — Yuanda Zhang
(74) *Attorney, Agent, or Firm* — Harrity & Harrity, LLP

(57) ABSTRACT

In some implementations, an emitter array may include a substrate, an epitaxial structure on the substrate, a plurality of bottom-emitting emitters defined in the epitaxial structure, a first electrical contact positioned at a top side of the epitaxial structure, a second electrical contact positioned at the top side of the epitaxial structure, and a metal layer disposed on a bottom side of the substrate. The metal layer may be electrically connected to the second electrical contact. The metal layer may include one or more openings for light emission of the plurality of bottom-emitting emitters.

20 Claims, 4 Drawing Sheets

BOTTOM-EMITTING EMITTER ARRAY WITH A BOTTOM SIDE METAL LAYER

CROSS-REFERENCE TO RELATED APPLICATION

This Patent Application claims priority to U.S. Provisional Patent Application No. 63/198,554, filed on Oct. 27, 2020, and entitled "BACKSIDE N-METAL CONFIGURATIONS FOR IMPROVED UNIFORMITY WIREBOND-FREE BOTTOM EMITTING VCSEL." The disclosure of the prior Application is considered part of and is incorporated by reference into this Patent Application.

TECHNICAL FIELD

The present disclosure relates generally to lasers and to a bottom-emitting emitter array with a bottom side metal layer.

BACKGROUND

A vertical-emitting device, such as a vertical cavity surface emitting laser (VCSEL), may include a laser and/or an optical transmitter, among other examples, in which a beam is emitted in a direction perpendicular to a surface of a substrate (e.g., vertically from a surface of a semiconductor wafer). Multiple vertical-emitting devices may be arranged in one or more emitter arrays (e.g., VCSEL arrays) on a common substrate.

SUMMARY

In some implementations, an emitter array includes a substrate; an epitaxial structure on the substrate; a plurality of bottom-emitting emitters defined in the epitaxial structure; a first electrical contact positioned at a top side of the epitaxial structure; a second electrical contact positioned at the top side of the epitaxial structure; and a metal layer disposed on a bottom side of the substrate, where the metal layer is electrically connected to the second electrical contact, and where the metal layer includes one or more openings for light emission of the plurality of bottom-emitting emitters.

In some implementations, a VCSEL array includes a substrate; an epitaxial structure on the substrate; a plurality of bottom-emitting VCSELs defined in the epitaxial structure; a first electrical contact positioned at a top side of the epitaxial structure; a second electrical contact positioned at the top side of the epitaxial structure; and a metal layer disposed on a bottom side of the substrate, where the metal layer includes one or more openings.

In some implementations, an optical source includes an emitter array that includes a substrate; an epitaxial structure on the substrate, the epitaxial structure including a top mirror and a bottom mirror; a plurality of bottom-emitting emitters defined in the epitaxial structure; a first electrical contact positioned at a top side of the epitaxial structure; a second electrical contact positioned at the top side of the epitaxial structure, where the second electrical contact is laterally distanced from the plurality of bottom-emitting emitters; and a metal layer disposed on a bottom side of the substrate, where the metal layer includes one or more openings for light emission of the plurality of bottom-emitting emitters.

DETAILED DESCRIPTION

Figure 1:
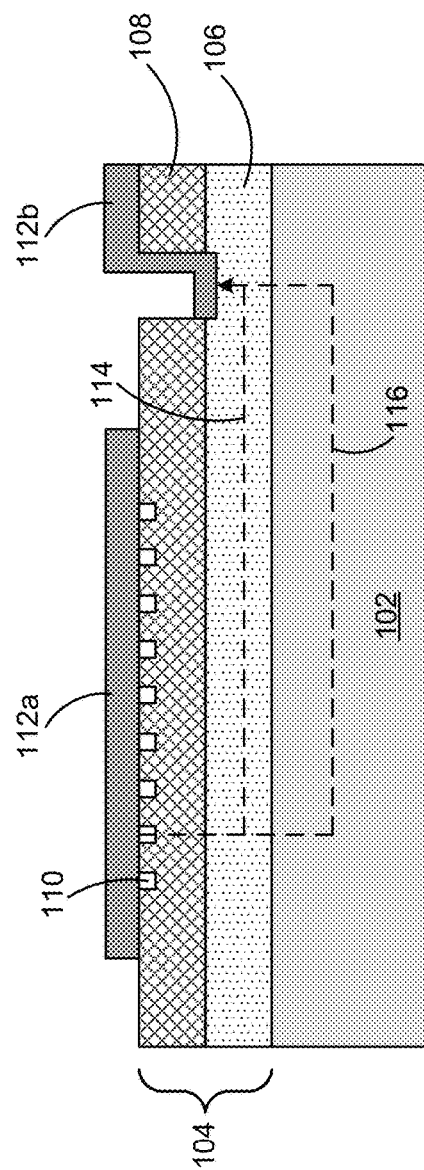
FIG. 1 is a diagram illustrating an example cross-section of an emitter array described herein.

The following detailed description of example implementations refers to the accompanying drawings. The same reference numbers in different drawings may identify the same or similar elements.

As described above, a vertical-emitting device, such as a vertical cavity surface emitting laser (VCSEL), is a laser in which a beam is emitted in a direction perpendicular to a surface of a substrate (e.g., vertically from a surface of a semiconductor wafer). A VCSEL may be formed in epitaxial layers, of an epitaxial structure, that include one or more active layers (e.g., gain regions). A VCSEL may be a top emitting VCSEL or a backside emitting or bottom emitting (BE) VCSEL. In some cases, a device may employ a single VCSEL, or may employ a plurality of VCSELs arranged in one or more emitter arrays on a common substrate (e.g., on a singlet die or on a single chip).

Typically, a BE VCSEL array may include a set of electrical contacts on a top side of the VCSEL array. For example, the BE VCSEL array may include an anode contact on the top side of the BE VCSEL array that is situated above the plurality of VCSELs, and a cathode contact on the top side of the BE VCSEL array that is laterally distanced from the plurality of VCSELs. In this configuration, current may flow from the anode, through at least one active region in the epitaxial structure, and into the cathode. Due to the lateral separation between the anode and cathode, carriers must travel a relatively long path for current flow, which adds resistance across the BE VCSEL array. This may result in an optical power gradient across the BE VCSEL array, such that the BE VCSEL array lacks optical power uniformity. For example, VCSELs closer to the cathode may detect higher voltage, resulting in higher bias current per VCSEL, while VCSELs further from the cathode may detect lower voltage, resulting in lower bias current per VCSEL. Thus, in particular detection and sensing applications, where accuracy is dependent upon the uniformity of the optical power, the BE VCSEL array may be unsuitable or may require additional, complex systems to compensate for the lack of optical power uniformity.

Some implementations described herein provide a BE emitter array (e.g., a BE VCSEL array) with improved optical power uniformity. The emitter array may include an epitaxial structure in which a plurality of BE emitters are formed. The top side of the BE emitter array may include a set of electrical contacts, and the bottom side of the emitter array may include a metal layer. The metal layer may reduce a lateral voltage gradient of the emitter array, thereby reducing an optical power gradient across the emitter array. In this way, the emitter array has improved optical power uniformity without increasing chip size. Accordingly, the emitter array may enable optical detection and sensing to be performed with improved accuracy. In some implementations, an optical source (e.g., for sensing applications) may include the BE emitter array. In some implementations, a method may include generating (or forming) an array of light spots for three-dimensional sensing using the BE emitter array described herein.

FIG. 1 is a diagram illustrating an example cross-section of an emitter array 100 described herein. As shown in FIG. 1, the emitter array 100 may include a substrate 102 and an epitaxial structure 104 (e.g., including a plurality of epitaxial layers). The epitaxial structure 104 may include a bottom mirror 106 and a top mirror 108. Between the bottom mirror 106 and the top mirror 108, the epitaxial structure 104 may include one or more additional layers, such as one or more active layers, one or more confinement (e.g., optical confinement) layers, and/or one or more tunnel junction layers. A plurality of emitters may be formed in the epitaxial structure 104. Reference number 110 shows example positions of the plurality of emitters (which may be referenced herein using reference number 110) at a surface of the epitaxial structure 104. The plurality of emitters 110 may extend into the epitaxial structure 104 through one or more layers of the epitaxial structure 104 described herein (e.g., the top mirror 108, the one or more additional layers, and the bottom mirror 106). The emitter array 100 also may include a set of electrical contacts 112 (shown as a first electrical contact 112a and a second electrical contact 112b). In some implementations, the emitter array 100 may be manufactured using a series of procedures. For example, one or more layers of the emitter array 100 may be created using one or more growth procedures, one or more deposition procedures, one or more etching procedures, one or more oxidation procedures, one or more implantation procedures, and/or one or more metallization procedures, among other examples.

The emitter array 100 shown in FIG. 1 is illustrated as a BE emitter array (e.g., the plurality of emitters 110 are BE emitters that emit light through the substrate 102). In some implementations, the emitter array 100 is a VCSEL array, and the plurality of emitters 110 are a plurality of VCSELs (e.g., BE VCSELs).

The substrate 102 includes a substrate upon which the epitaxial structure 104 is grown. In some implementations, the substrate 102 may be formed from a semiconductor material, such as gallium arsenide (GaAs), indium phosphide (InP), and/or another type of semiconductor material. In some examples, the substrate 102 may be semi-insulating or N-doped.

The epitaxial structure 104 includes a set of layers grown on the substrate 102. In some implementations, the epitaxial structure 104 may include a set of aluminum GaAs (AlGaAs) layers grown on the substrate 102 (e.g., a GaAs substrate). In some implementations, the epitaxial structure 104 may be grown on the substrate 102 using a metal-organic chemical vapor deposition (MOCVD) technique and/or a molecular beam epitaxy (MBE) technique, among other examples.

As shown in FIG. 1, the epitaxial structure 104 includes the bottom mirror 106. The bottom mirror 106 includes a bottom reflector layer of the emitter array 100. The epitaxial structure 104 also includes the top mirror 108. The top mirror 108 includes a top reflector layer of the emitter array 100. The bottom mirror 106 and the top mirror 108 may form an optical resonator of the emitter array 100. The bottom mirror 106 and/or the top mirror 108 may include a Distributed Bragg Reflector (DBR) and/or a dielectric mirror, among other examples. For example, the bottom mirror 106 may include an N-DBR layer and the top mirror 108 may include a P-DBR layer.

The epitaxial structure 104 may include one or more active layers (not shown) between the bottom mirror 106 and the top mirror 108. An active layer may include an active region where electrons and holes recombine to emit light. For example, the active region may include one or more quantum wells. Moreover, the epitaxial structure 104 may include one or more confinement layers (not shown) that provide (e.g., via an aperture) optical and/or electrical confinement. For example, the epitaxial structure 104 may include one or more oxidation layers. An oxidation layer may be formed as a result of oxidation of one or more epitaxial layers of the epitaxial structure 104. For example, an oxidation layer may be an aluminum oxide ($Al_2O_3$) layer formed as a result of oxidation of an epitaxial layer (e.g., an AlGaAs layer and/or an aluminum arsenide (AlAs) layer, among other examples). In addition, the epitaxial structure 104 may include one or more tunnel junctions (not shown) (e.g., between active layers) that provide conduction of carriers so that the carriers can be used for additional stimulated recombination events. A tunnel junction may be formed of layers (e.g., thin layers) of highly-doped semiconductor materials (e.g., one or more N++ layers and one or more P++ layers).

The emitter array 100 may include the first electrical contact 112a and the second electrical contact 112b to enable electrical current to flow through the emitter array 100. The first electrical contact 112a and the second electrical contact 112b may be metal contacts, such as ohmic metal contacts. In some implementations, the first electrical contact 112a is a P-metal contact, and the second electrical contact 112b is an N-metal contact. For example, the first electrical contact 112a may be an anode contact and the second electrical contact 112b may be a cathode contact. In some implementations, the first electrical contact 112a and the second electrical contact 112b may both be N-metal contacts (or P-metal contacts), and the epitaxial structure 104 may include one or more tunnel junctions. In some implementations, the first electrical contact 112a and/or the second electrical contact 112b may include an annealed metallization layer. For example, the first electrical contact 112a and/or the second electrical contact 112b may include a chromium-gold (Cr—Au) layer, gold-zinc (Au—Zn), or a titanium-platinum-gold (TiPtAu) layer, among other examples, through which electrical current may flow.

The first electrical contact 112a may be positioned at the top side (e.g., the front side) of the emitter array 100 (e.g., opposite the substrate 102 and adjacent the epitaxial structure 104). The position of the first electrical contact 112a may define the location of the plurality of emitters 110 in the epitaxial structure 104 (e.g., the first electrical contact 112a may vertically align with the plurality of emitters 110). The second electrical contact 112b also may be positioned at the top side of the emitter array 100. The second electrical contact 112b may be laterally distanced from the plurality of emitters 110 (e.g., the second electrical contact 112b may not vertically align with the plurality of emitters 110). The second electrical contact 112b may fill a trench that extends to the bottom mirror 106 (e.g., the N-DBR layer), the substrate 102, or a separate contact layer (e.g., a separate N-doped contact layer). The first electrical contact 112a and the second electrical contact 112b may be electrically separated from each other.

The second electrical contact 112b may be electrically connected to the bottom mirror 106 (e.g., the N-DBR layer) and/or the substrate 102. Thus, current may flow (as shown by current path 114) from the first electrical contact 112a (e.g., the P-metal contact), through an active region, the bottom mirror 106 (e.g., the N-DBR layer), and/or one or more N-doped layers, and into the second electrical contact 112b (e.g., the N-metal contact). If the second electrical contact 112b is electrically connected to the substrate 102

(e.g., the substrate 102 is N-substrate), current can also flow laterally through the substrate 102 (as shown by current path 116). Accordingly, as described above, because carriers must travel a relatively long path between the first electrical contact 112a and the second electrical contact 112b, resistance is added across the emitter array 100 resulting in an optical power gradient.

The emitter array 100 in FIG. 1 is shown in a planar configuration (e.g., with oxidation trenches). In some implementations, the emitter array 100 may have an oxide-confined configuration, an implant-only configuration (e.g., for current confinement), or a non-planar configuration, such as a mesa configuration. In the mesa configuration, oxidation trenches are not etched in the epitaxial structure 104. Rather, areas of the epitaxial structure 104 are etched to leave a respective mesa for each emitter 110.

In some implementations, the emitter array 100 is configured for wirebond-free attachment to another substrate, such as a sub-mount and/or a printed circuit board, among other examples. For example, the emitter array 100 may be configured for flip-chip bonding (e.g., the emitter array 100 does not include an electrical contact on the bottom side of the emitter array 100, adjacent the substrate 102).

In some implementations, the emitter array 100 may be manufactured using a series of steps. For example, the bottom mirror 106, an active layer, an oxidation layer, and the top mirror 108 may be epitaxially grown on the substrate 102, after which the first electrical contact 112a (e.g., the P-metal contact) may be deposited on the top mirror 108. Next, oxidation trenches may be etched to expose the oxidation layer for oxidation. The second electrical contact 112b (e.g., the N-metal contact) may be deposited in an oxidation trench and on the top mirror 108. In some implementations, an implant isolation material may be created via ion implantation, after which a dielectric passivation/mirror layer may be deposited. In some implementations, dielectric via openings may be etched in the dielectric passivation/mirror layer (e.g., to expose the P-metal contact). Plating, seeding, and etching may be performed, after which the substrate 102 may be thinned and/or lapped to a target thickness.

The quantity and arrangement of layers shown in FIG. 1 are provided as an example. In practice, the emitter array 100 may include additional layers, fewer layers, different layers, or differently arranged layers than those shown in FIG. 1. Additionally, or alternatively, a set of layers (e.g., one or more layers) of the emitter array 100 may perform one or more functions described as being performed by another set of layers of the emitter array 100, respectively.

While the design of the emitter array 100 is described as including a plurality of VCSELs, other implementations are possible. For example, the design of the emitter array 100 may apply in the context of another type of optical device, such as a light emitting diode (LED), or another type of vertical emitting (e.g., bottom emitting) optical device. Additionally, the design of the emitter array 100 may apply to emitters of any wavelength, power level, emission profile, or the like. In other words, the emitter array 100 is not particular to an emitter with a given performance characteristic. In some implementations, the emitters 110 may output at wavelengths between 900 nanometers (nm) to 1550 nm.

Figure 2:
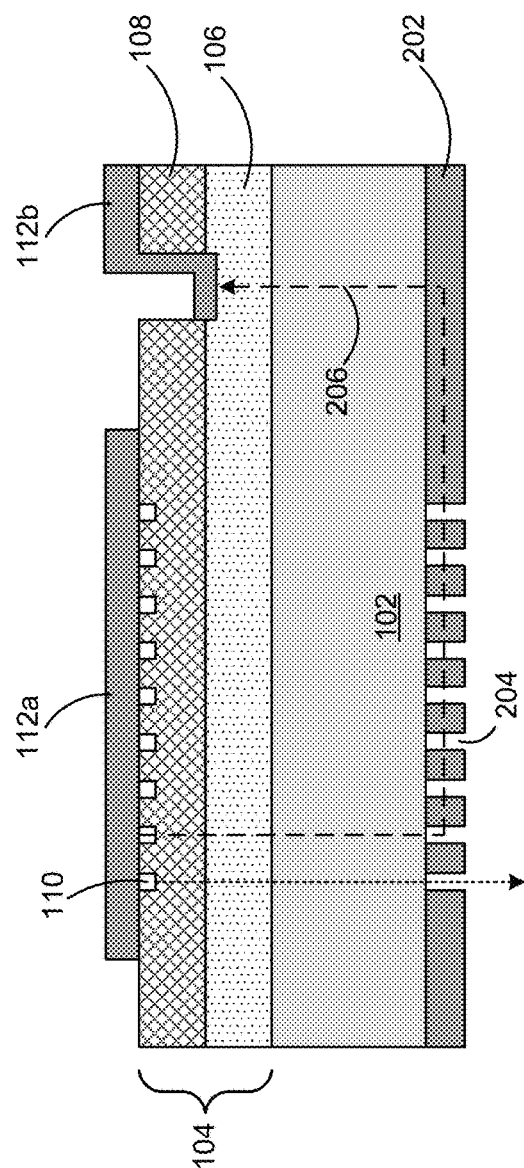
FIG. 2 is a diagram illustrating an example cross-section of an emitter array described herein.

FIG. 2 is a diagram illustrating an example cross-section of an emitter array 200 described herein. As shown in FIG. 2, the emitter array 200 may have a similar structure to the emitter array 100. That is, the emitter array 200 may include the substrate 102, the epitaxial structure 104, the plurality of emitters 110, and the set of electrical contacts 112, as described above. In addition, the emitter array 200 may include a metal layer 202. The metal layer 202 may be disposed on the bottom side (e.g., the back side) of the emitter array 200 (e.g., opposite the epitaxial structure 104 and adjacent the substrate 102). The metal layer 202 may include one or more openings 204. The one or more openings 204 may be configured to pass light emission from the plurality of emitters 110 as shown by the vertical line and downward arrow.

The metal layer 202 may include a conductive layer through which current can flow. For example, the metal layer 202 may include an ohmic metal layer. In some implementations, the metal layer 202 may be composed of the same material as the electrical contacts 112a and 112b (e.g., Cr—Au, Au—Zn, or TiPtAu, among other examples). The metal layer 202 may have an electrical connection to the second electrical contact 112b, the bottom mirror 106, and/or the substrate 102. For example, the second electrical contact may include an N-metal contact, the bottom mirror 106 may include an N-DBR layer, and the substrate may include an N-substrate, as described above, and the metal layer 202 may include an N-metal layer. In this way, current can flow laterally across the metal layer 202 (shown by current path 206). Moreover, current can flow across the metal layer 202 with less resistance relative to the bottom mirror 106 or the substrate 102, thereby reducing an optical power gradient across the emitter array 200.

In some implementations, the substrate 102 may include integrated optics. For example, the bottom of the substrate 102 (e.g., opposite the epitaxial structure 104) may be formed into one or more optical components, such as one or more lenses, diffusers, and/or diffractive optical elements, among other examples. Here, one or more optical components may align with an opening 204 (e.g., such that vertical light emission of one or more emitters 110 passes through the one or more optical components before passing through the opening 204).

In some implementations, the polarity of the emitter array 200 may be reversed from the description described herein. For example, the first electrical contact 112a may include an N-metal contact, the second electrical contact 112b may include a P-metal contact, the bottom mirror 106 may include a P-DBR layer, the substrate may include a P-substrate, and the metal layer 202 may include a P-metal layer.

As indicated above, FIG. 2 is provided as an example. Other examples may differ from what is described with regard to FIG. 2.

Figure 3:
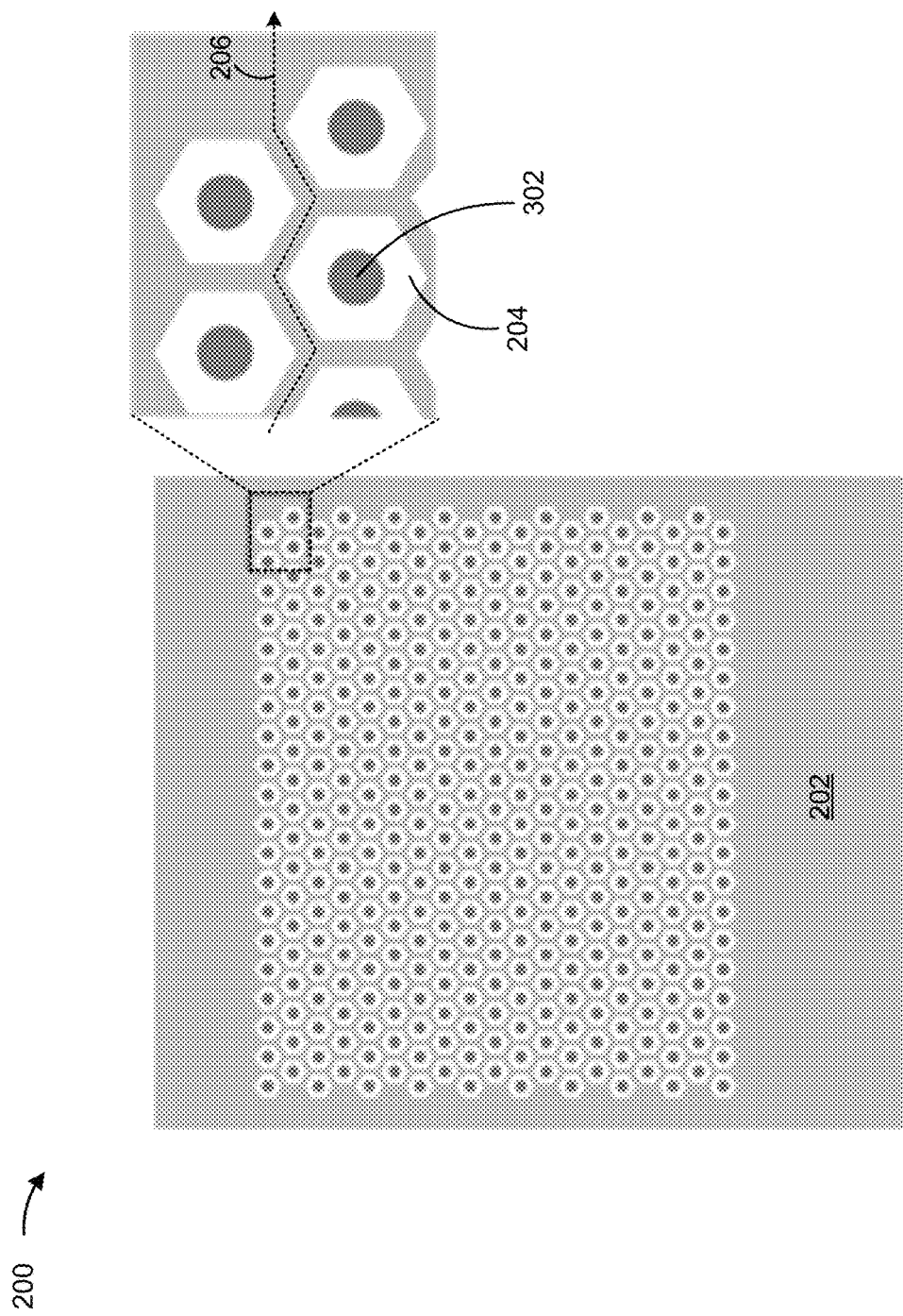
FIG. 3 is a diagram illustrating an example bottom side of the emitter array of FIG. 2.

FIG. 3 is a diagram illustrating an example bottom side of the emitter array 200 of FIG. 2. In particular, FIG. 3 shows a bottom view of an example metal layer 202. As shown, the metal layer 202 may include respective openings 204 for the plurality of emitters 110. Here, an emission area 302 (e.g., an active area) of each emitter 110 may align with a respective opening 204 in the metal layer 202 (e.g., such that a vertical light emission of the emitter 110 passes through the opening 204). The metal traces of the metal layer 202 between the respective openings 204 for the emitters 110 provide lateral current transport (shown by current path 206), which reduces resistance and an optical power gradient across the emitter array 200.

The openings 204 may be hexagonal, as shown, or may be another shape such as rectangular or circular. The openings 204 may be uniformly or non-uniformly distributed across the metal layer 202 to accommodate uniformly or non-uniformly distributed emitters 110 in the emitter array 200, respectively.

The openings 204 may have a width (e.g., a smallest dimension) that allows for minimal light blocking that may result from process misalignment and/or light divergence within the substrate 102. For example, alignment error may be from about 1 to 5 micrometers (μm), and divergence within the substrate 102 may be from about 5 to 10 μm. Accordingly, the openings 204 may have a width that is 10 μm or 20 μm wider than the width of an emission area 302 of an emitter 110. For example, the openings 204 may have a width of about 30 μm in connection with emitters 110 that have an emission area 302 that is 10 μm wide. Moreover, the spacing between adjacent openings 204 (e.g., between center points of adjacent openings 204) may be based on the width of the openings 204 and/or an alignment error associated with the application of an anti-reflection (AR) coating and/or the metal layer 202. For example, a minimum distance between adjacent openings 204 may be about 40 μm in connection with emitters 110 that have an emission area 302 that is 10 μm wide. Stated differently, a minimum distance between adjacent emitters 110 (e.g., between center points of emission areas 302 of adjacent emitters 110), that have 10 μm emission areas 302, may be about 40 μm.

In some implementations, AR coating may be applied to the bottom side of the substrate 102. For example, AR coating may be disposed on the bottom side of the substrate 102 in alignment with each of the respective openings 204. As an example, AR coating may be disposed in each of the respective openings 204 (e.g., rather than the AR coating being applied as a layer). In some implementations, the emitter array 200 may be configured for use with copper (Cu) pillars. Copper pillars may include a metal post attached by solder to a die and a package substrate, and may provide heat sink and/or electrical conductivity properties. Thus, copper pillars may provide flip-chip interconnection of the emitter array 200 to another substrate, as described above. Here, respective copper pillars may be connected to the emitter array 200 in alignment with each of the plurality of emitters 110.

As indicated above, FIG. 3 is provided as an example. Other examples may differ from what is described with regard to FIG. 3.

Figure 4:
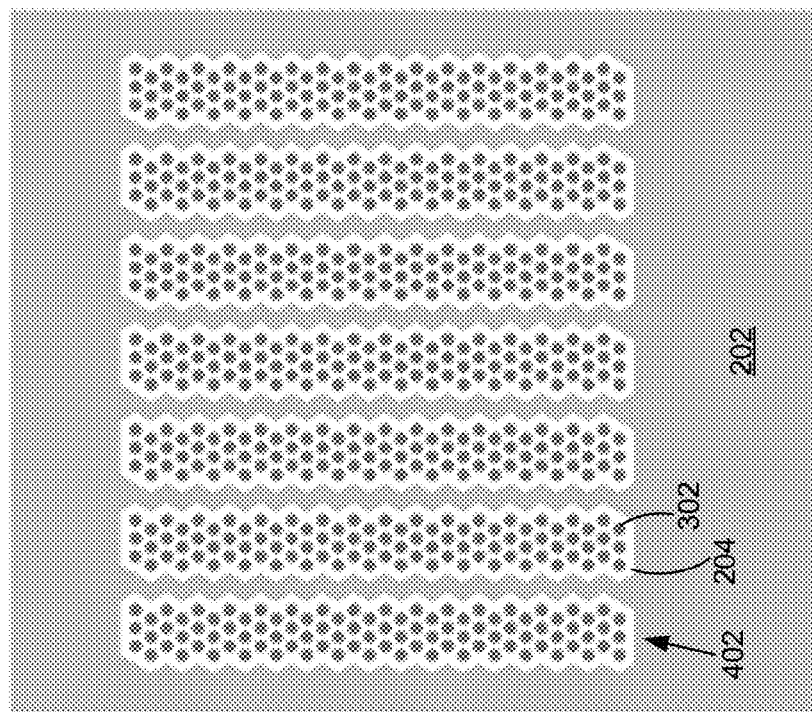
FIG. 4 is a diagram illustrating an example bottom side of the emitter array of FIG. 2.

FIG. 4 is a diagram illustrating an example bottom side of the emitter array 200 of FIG. 2. In particular, FIG. 4 shows a bottom view of an example metal layer 202. As shown, the metal layer 202 may include respective openings 204 for emitter subarrays 402 (or "groups") of the plurality of emitters 110. An emitter subarray 402 may include multiple emitters of the plurality of emitters 110, and each emitter subarray 402 may include different emitters of the plurality of emitters 110. Here, emission areas 302 of multiple emitters 110 may align with a respective opening 204 in the metal layer 202 (e.g., such that vertical light emissions of the multiple emitters 110 pass through the opening 204). The metal traces of the metal layer 202 between the respective openings 204 for the emitter subarrays 402 provide lateral current transport, which reduces resistance and an optical power gradient across the emitter array 200.

An emitter subarray 402 may be arranged in a column of emitters 110, a row of emitters 110, and/or a cluster of emitters 110, among other examples. Accordingly, the openings 204 may be configured for columns of emitters 110 and/or rows of emitters (e.g., elongated openings that run from front-to-back of the metal layer 202 and/or from side-to-side of the metal layer 202) and/or configured for clusters of emitters 110 (e.g., circular openings, square openings, and/or hexagonal openings, among other examples). In some implementations, a first emitter subarray 402 and a second emitter subarray 402 may have different arrangements (e.g., the first emitter subarray 402 may be arranged in a column and the second emitter subarray 402 may be arranged in a cluster) and/or may include different quantities of emitters 110. Accordingly, a first opening 204 and a second opening 204 may have different shapes (e.g., to accommodate different arrangements of emitter subarrays 402) and/or different sizes (e.g., to accommodate different quantities of emitters 110). The openings 204 may be uniformly or non-uniformly distributed across the metal layer 202 to accommodate uniformly or non-uniformly distributed emitter subarrays 402 in the emitter array 200, respectively.

In some implementations, different sets of adjacent openings 204 may have different opening-to-opening spacings (e.g., a minimum distance between edges of openings). For example, a first minimum distance between adjacent edges of a first opening 204 and a second opening 204 may be different from a second minimum distance between adjacent edges of a third opening 204 and a fourth opening 204. In the multiple-group configuration of FIG. 4, adjacent emitters 110 may be closer together than the emitters 110 in the configuration of FIG. 3. For example, a minimum distance between adjacent emitters 110 (e.g., between center points of emission areas 302 of adjacent emitters 110), that have 10 μm emission areas 302, may be about 18 μm.

In some implementations, AR coating may be disposed on the bottom side of the substrate 102 in alignment with each of the respective openings 204, as described above. In the multiple-group configuration of FIG. 4, alignment error associated with the AR coating may be reduced relative to the configuration of FIG. 3 due to the use of larger openings 204 in the multiple-group configuration. In addition, the multiple-group configuration, which uses relatively larger openings 204, may facilitate integration of optical components on the substrate 102, as described above. Moreover, in the multiple-group configuration, respective copper pillar blocks may be connected to the emitter array 200 in alignment with each of the openings 204 (e.g., rather than each emitter 110 individually), thereby facilitating use of copper pillar technology.

As indicated above, FIG. 4 is provided as an example. Other examples may differ from what is described with regard to FIG. 4.

The foregoing disclosure provides illustration and description but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An emitter array, comprising:
    a substrate;
    an epitaxial structure on the substrate;
    a plurality of bottom-emitting emitters defined in the epitaxial structure;
    a first electrical contact positioned at a top side of the epitaxial structure;
    a second electrical contact positioned at the top side of the epitaxial structure; and
    a metal layer disposed on a bottom side of the substrate,
        wherein the metal layer is electrically connected to the second electrical contact,
        wherein the metal layer is configured to have a current path for a current, from the first electrical contact, to flow laterally across the metal layer and into the second electrical contact, and
        wherein the metal layer includes one or more openings for light emission of the plurality of bottom-emitting emitters.

2. The emitter array of claim 1, wherein the plurality of bottom-emitting emitters comprise a plurality of bottom-emitting vertical cavity surface emitting lasers.

3. The emitter array of claim 1, wherein the first electrical contact is an anode contact and the second electrical contact is a cathode contact.

4. The emitter array of claim 1, wherein the metal layer is electrically connected to the substrate.

5. The emitter array of claim 1, wherein the epitaxial structure includes a top mirror and a bottom mirror.

6. The emitter array of claim 5, wherein the metal layer is electrically connected to the bottom mirror.

7. The emitter array of claim 5, wherein the first electrical contact is disposed on the top mirror.

8. The emitter array of claim 5, wherein the epitaxial structure includes a trench that extends from the top mirror to the bottom mirror, and
    wherein the second electrical contact is disposed in the trench.

9. The emitter array of claim 1, wherein the metal layer includes respective openings for the plurality of bottom-emitting emitters.

10. The emitter array of claim 9, wherein an opening, of the respective openings, aligns with an emission area of an emitter of the plurality of bottom-emitting emitters.

11. The emitter array of claim 1, wherein the metal layer includes respective openings for one or more emitter sub-arrays of the plurality of bottom-emitting emitters.

12. The emitter array of claim 11, wherein an opening, of the respective openings, aligns with emission areas of multiple emitters of the plurality of bottom-emitting emitters.

13. The emitter array of claim 1, wherein anti-reflection coating is disposed on the bottom side of the substrate within the one or more openings.

14. The emitter array of claim 1, wherein the bottom side of the substrate includes one or more integrated optical components that align with the one or more openings.

15. A vertical-cavity surface-emitting laser (VCSEL) array, comprising:
    a substrate;
    an epitaxial structure on the substrate;
    a plurality of bottom-emitting VCSELs defined in the epitaxial structure;
    a first electrical contact positioned at a top side of the epitaxial structure;
    a second electrical contact positioned at the top side of the epitaxial structure; and
    a metal layer disposed on a bottom side of the substrate,
        wherein the metal layer is electrically connected to the second electrical contact,
        wherein the metal layer is configured to have a current path for a current, from the first electrical contact, to flow laterally across the metal layer and into the second electrical contact, and
        wherein the metal layer includes one or more openings.

16. The VCSEL array of claim 15, wherein the second electrical contact is laterally distanced from the plurality of bottom-emitting VCSELs.

17. The VCSEL array of claim 15, wherein the metal layer includes respective openings for the plurality of bottom-emitting VCSELs.

18. The VCSEL array of claim 15, wherein the metal layer includes respective openings for one or more VCSEL sub-arrays of the plurality of bottom-emitting VCSELs.

19. An optical source, comprising:
    an emitter array that comprises:
        a substrate;
        an epitaxial structure on the substrate, the epitaxial structure including a top mirror and a bottom mirror;
        a plurality of bottom-emitting emitters defined in the epitaxial structure;
        a first electrical contact positioned at a top side of the epitaxial structure;
        a second electrical contact positioned at the top side of the epitaxial structure,
            wherein the second electrical contact is laterally distanced from the plurality of bottom-emitting emitters; and
        a metal layer disposed on a bottom side of the substrate, wherein the metal layer is electrically connected to the substrate, the bottom mirror, and the second electrical contact, wherein the metal layer is configured to have a current path for a current, from the first electrical contact, to flow laterally across the metal layer and into the second electrical contact, and wherein the metal layer includes one or more openings for light emission of the plurality of bottom-emitting emitters.

20. The optical source of claim 19, wherein the metal layer includes respective openings for one or more emitter subarrays of the plurality of bottom-emitting emitters.

* * * * *